(12) United States Patent
Lee et al.

(10) Patent No.: US 10,476,036 B2
(45) Date of Patent: Nov. 12, 2019

(54) ORGANIC LIGHT EMITTING DIODE DISPLAY DEVICE COMPRISING CAPPING LAYER

(71) Applicant: Samsung Display Co., Ltd., Yongin-si, Gyeonggi-do (KR)

(72) Inventors: Jihye Lee, Incheon (KR); Dongchan Kim, Gunpo-si (KR); Donghoon Kim, Suwon-si (KR); Wonjong Kim, Suwon-si (KR); Jiyoung Moon, Gwangju-si (KR); Dongkyu Seo, Suwon-si (KR); Dahea Im, Incheon (KR); Sanghoon Yim, Suwon-si (KR); Yoonhyeung Cho, Yongin-si (KR); Wonsuk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/713,407

(22) Filed: Sep. 22, 2017

(65) Prior Publication Data

US 2018/0090718 A1    Mar. 29, 2018

(30) Foreign Application Priority Data

Sep. 23, 2016    (KR) .................. 10-2016-0122282

(51) Int. Cl.
| | |
|---|---|
| *H01L 51/52* | (2006.01) |
| *H01L 51/50* | (2006.01) |
| *H01L 27/32* | (2006.01) |
| *H01L 29/08* | (2006.01) |
| *H01L 35/24* | (2006.01) |
| *H01L 51/00* | (2006.01) |

(52) U.S. Cl.
CPC ........ *H01L 51/5275* (2013.01); *H01L 51/504* (2013.01); *H01L 51/5253* (2013.01); *H01L 27/3244* (2013.01); *H01L 51/5278* (2013.01); *H01L 2251/301* (2013.01); *H01L 2251/558* (2013.01)

(58) Field of Classification Search
CPC ............ H01L 51/5259; H01L 51/5253; H01L 2251/5369; H01L 21/56; H01L 51/5275; H01L 51/504; H01L 27/3244; H01L 2251/301; H01L 2251/558
USPC .............. 257/40, E23.137, E33.059; 438/26; 313/512
See application file for complete search history.

(56) References Cited

U.S. PATENT DOCUMENTS

| | | | |
|---|---|---|---|
| 5,882,761 A * | 3/1999 | Kawami | ................ H05B 33/04 252/301.16 |
| 9,095,033 B2 | 7/2015 | Naraoka et al. | |

(Continued)

FOREIGN PATENT DOCUMENTS

| | | |
|---|---|---|
| KR | 10-2012-0080536 A | 7/2012 |
| KR | 10-2014-0116044 A | 10/2014 |
| KR | 10-2016-0078424 A | 7/2016 |

*Primary Examiner* — Nduka E Ojeh
(74) *Attorney, Agent, or Firm* — Lewis Roca Rothgerber Christie LLP

(57) ABSTRACT

An organic light emitting diode display device includes a substrate, an organic light emitting diode on the substrate and a capping layer on the organic light emitting diode. The capping layer includes metal iodide selected from alkali metal iodide and alkaline-earth metal iodide. The organic light emitting diode may have reduced driving voltage and improved luminous efficiency.

19 Claims, 10 Drawing Sheets

(56) References Cited

U.S. PATENT DOCUMENTS

| | | | |
|---|---|---|---|
| 2004/0150332 A1* | 8/2004 | Hwang | H01L 51/5246 313/512 |
| 2005/0277355 A1* | 12/2005 | Choi | H01L 51/5246 445/25 |
| 2008/0268282 A1* | 10/2008 | Spindler | C09K 11/06 428/690 |
| 2012/0292516 A1* | 11/2012 | Yasui | C09K 11/616 250/361 R |
| 2013/0248867 A1 | 9/2013 | Kim et al. | |
| 2014/0183492 A1 | 7/2014 | Park et al. | |
| 2014/0319497 A1 | 10/2014 | Cho et al. | |
| 2015/0123086 A1* | 5/2015 | Lee | H01L 51/5275 257/40 |
| 2015/0129783 A1* | 5/2015 | Kondo | G01T 1/20 250/588 |
| 2015/0147837 A1* | 5/2015 | Kwon | H01L 27/1259 438/34 |
| 2016/0049613 A1 | 2/2016 | Kang et al. | |
| 2016/0079498 A1* | 3/2016 | Lawrence | H01L 33/60 257/98 |
| 2016/0267873 A1 | 9/2016 | Saotome et al. | |
| 2016/0329521 A1* | 11/2016 | Kim | H01L 51/5253 |
| 2016/0380235 A1* | 12/2016 | Kim | H01L 51/0061 257/40 |

\* cited by examiner

ORGANIC LIGHT EMITTING DIODE DISPLAY DEVICE COMPRISING CAPPING LAYER

CROSS-REFERENCE TO RELATED APPLICATION

This application claims priority to and the benefit of Korean Patent Application No. 10-2016-0122282, filed on Sep. 23, 2016, in the Korean Intellectual Property Office (KIPO), the entire content of which is incorporated herein by reference.

BACKGROUND

1. Field

One or more aspects of embodiments of the present invention relate to an organic light emitting diode ("OLED") display device, and more particularly, to an OLED display device including a capping layer including metal iodide.

2. Discussion of Related Art

Organic light emitting diode ("OLED") display devices are a self-luminous display device that displays an image using an OLED that emits light. The OLED display devices do not require a separate light source, which differentiates these devices from, for example, liquid crystal display ("LCD") devices, and thus OLEDs have relatively small (slim) thickness and light weight. In addition, the OLED display devices are currently garnering attention as a next generation display device by virtue of their characteristics such as low power consumption, high luminance and high response speed.

An example OLED display device includes a hole injection electrode, an organic emissive layer and an electron injection electrode. Holes provided from the hole injection electrode and electrons provided from the electron injection electrode are combined in the organic emissive layer to form excitons. The OLED emits light when these excitons fall from an excited state to a ground state.

A capping layer (CPL) may be disposed (e.g., positioned) on the OLED to protect the OLED and effectively (or suitably) extract light generated in the organic emissive layer.

It is to be understood that this background section is intended to provide useful background information for understanding the relevant technology and the like disclosed herein. This background section may include ideas, concepts and/or recognitions that were not part of what was known or appreciated by those skilled in the pertinent art, prior to a corresponding effective filing date of subject matter disclosed herein.

SUMMARY

One or more aspects of one or more embodiments of the present invention may be directed to an OLED display device including a capping layer.

According to an example embodiment, an organic light emitting diode display device includes a substrate, an organic light emitting diode on the substrate and a capping layer on the organic light emitting diode. The capping layer includes metal iodide.

The metal iodide may include at least one selected from alkali metal iodide and alkaline-earth metal iodide.

The metal iodide may include at least one selected from LiI, NaI, KI, RbI, CsI, $BeI_2$, $MgI_2$, $CaI_2$, $SrI_2$ and $BaI_2$.

The capping layer may have a refractive index ranging from about 1.6 to about 2.0.

The capping layer may have a thickness ranging from about 30 nm to about 100 nm.

The organic light emitting diode may include a first electrode on the substrate, an organic emissive layer on the first electrode and a second electrode on the organic emissive layer.

The organic light emitting diode may include at least one selected from a hole injection layer and a hole transport layer, between the first electrode and the organic emissive layer.

The organic light emitting diode may include at least one selected from an electron transport layer and an electron injection layer, between the organic emissive layer and the second electrode.

The organic light emitting diode display device may further include a thin film encapsulation layer on the capping layer. The thin film encapsulation layer may include at least one inorganic layer and at least one organic layer arranged alternately with the at least one inorganic layer.

The organic light emitting diode may include a first electrode on the substrate, a first light emitting unit on the first electrode, a charge generation layer on the first light emitting unit, a second light emitting unit on the charge generation layer and a second electrode on the second light emitting unit. The first light emitting unit may include a first organic emissive layer between the first electrode and the charge generation layer, and the second light emitting unit may include a second organic emissive layer between the charge generation layer and the second electrode.

One of the first organic emissive layer and the second organic emissive layer may be a blue emissive layer and the other one of the first organic emissive layer and the second organic emissive layer may be a yellow emissive layer.

The organic light emitting diode display device may further include a first auxiliary emissive layer between the first electrode and the first organic emissive layer.

The first auxiliary emissive layer may include at least one selected from a hole injection layer and a hole transport layer.

The organic light emitting diode display device may further include a second auxiliary emissive layer between the second organic emissive layer and the second electrode.

The second auxiliary emissive layer may include at least one selected from an electron transport layer and an electron injection layer.

The organic light emitting diode display device may further include a filler on the capping layer.

The filler may have substantially the same refractive index as a refractive index of the capping layer.

The organic light emitting diode display device may further include an encapsulation substrate on the filler.

The filler may have substantially the same refractive index as a refractive index of the encapsulation substrate.

The foregoing embodiments are provided only for purposes of illustration and are not intended to be in any way limiting the scope of the present disclosure. In addition to the illustrative aspects, example embodiments and features described above, further aspects, example embodiments and features will become more apparent by reference to the drawings and the following detailed description.

BRIEF DESCRIPTION OF THE DRAWINGS

These and/or other aspects of the present invention will become more apparent and more readily appreciated by describing in more detail example embodiments thereof with reference to the accompanying drawings, wherein.

DETAILED DESCRIPTION

Figure 1:
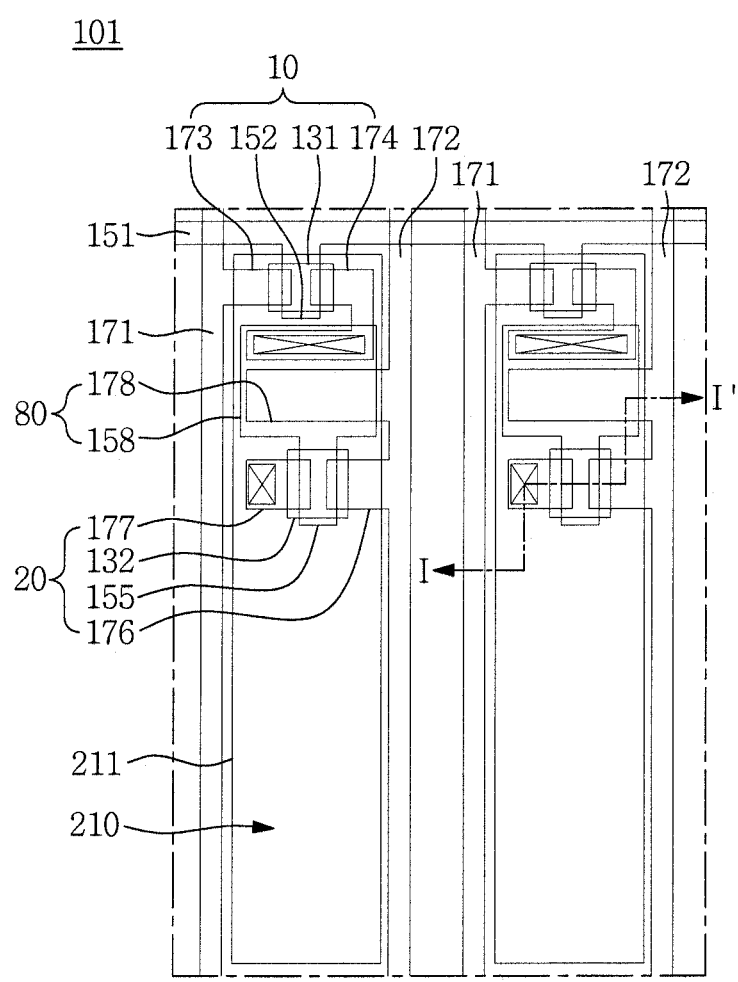
FIG. 1 is a plan view illustrating an OLED display device according to an example embodiment.

Example embodiments of the present disclosure will now be described more fully hereinafter with reference to the accompanying drawings. Although the present invention may be modified in various ways and have several example embodiments, example embodiments that are illustrated in the accompanying drawings will be mainly described in the present specification. However, the scope of the present invention is not limited to the described example embodiments and should be construed as including all the changes, equivalents, and substitutions within the spirit and scope of the present invention.

In the drawings, thicknesses of layers and areas may be enlarged for clarity and ease of description thereof. When a layer, area, or plate is referred to as being "on" another layer, area, or plate, it may be directly on the other layer, area, or plate; or intervening layer(s), area(s), or plate(s) may be present therebetween. Conversely, when a layer, area, or plate is referred to as being "directly on" another layer, area, or plate, no intervening layers, areas, or plates may be present therebetween. Further, when a layer, area, or plate is referred to as being "below" another layer, area, or plate, it may be directly below the other layer, area, or plate; or intervening layer(s), area(s), or plate(s) may be present therebetween. Conversely, when a layer, area, or plate is referred to as being "directly below" another layer, area, or plate, no intervening layers, areas, or plates may be present therebetween.

The spatially relative terms "below", "beneath", "less", "above", "upper", and the like, may be used herein for ease of description to describe the relations between one element or component and another element or component, as illustrated in the drawings. It will be understood, however, that the spatially relative terms are intended to encompass different orientations of the device in use or operation, in addition to the orientation depicted in the drawings. For example, in the case where a device illustrated in the drawing is turned over, the element(s) positioned "below" or "beneath" another element in the drawings may be placed "above" another element. Accordingly, the illustrative term "below" may include both the lower and upper positions. The device may also be oriented in another direction, and thus the spatially relative terms may be interpreted differently depending on the orientation of the device.

Throughout the specification, when an element is referred to as being "connected or coupled" to another element, the element may be "directly connected or coupled" to the other element, or "electrically connected or coupled" to the other element, with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be likewise termed differently, without departing from the scope of the present disclosure.

"About" or "approximately" as used herein may each be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as that which is commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined as such in the present specification.

Description of some of the elements associated with the present invention may be omitted in order to more clearly describe example embodiments of the present invention. Like reference numerals may refer to like elements throughout the specification and drawings.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

Hereinafter, an example embodiment will be described with reference to FIGS. 1 and 2.

Figure 2:
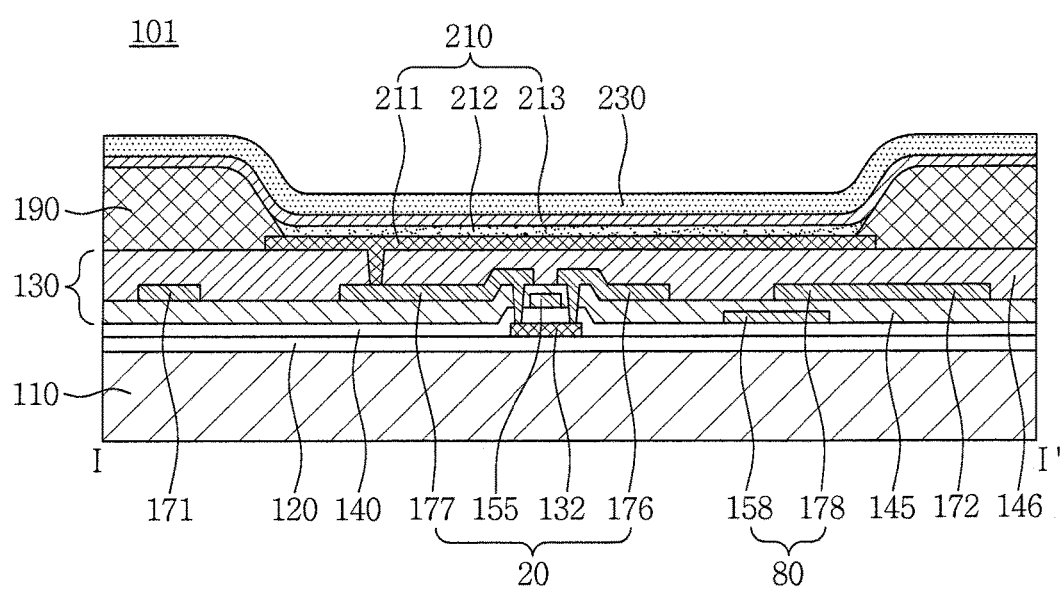
FIG. 2 is a cross-sectional view taken along line I-I' of FIG. 1.

FIG. 1 is a plan view illustrating an OLED display device 101 according to an example embodiment, and FIG. 2 is a cross-sectional view taken along line I-I' of FIG. 1.

As illustrated in FIGS. 1 and 2, the OLED display device 101 according to an example embodiment includes a substrate 110, a wiring unit 130, an OLED 210 and a capping layer 230.

The substrate 110 may include an insulating material selected from glass, quartz, ceramic, plastic, and the like. However, example embodiments are not limited thereto, and the substrate 110 may include a metallic material such as stainless steel, for example.

A buffer layer 120 is disposed (e.g., positioned) on the substrate 110. The buffer layer 120 may include one or more layers selected from suitable inorganic layers and organic layers. The buffer layer 120 serves to substantially prevent or reduce the permeation of undesirable elements, such as moisture, into the wiring unit 130 and/or the OLED 210, and to planarize a surface of the substrate 110 therebelow. However, in some example embodiments, the buffer layer 120 may be omitted.

The wiring unit 130 may be disposed on the buffer layer 120. The wiring unit 130 may include a switching thin film transistor ("TFT") 10, a driving TFT 20 and a capacitor 80, and may drive the OLED 210. The OLED 210 emits light according to a driving signal received from the wiring unit 130 to display an image.

FIGS. 1 and 2 illustrate an active matrix-type (or kind) organic light emitting diode (AMOLED) display device 101 having a 2Tr-1Cap structure. For example, the 2Tr-1Cap structure may include two TFTs, for example, the switching TFT 10 and the driving TFT 20, and one capacitor 80 in each pixel, but example embodiments are not limited thereto. For example, the OLED display device 101 may include three or more TFTs and two or more capacitors in each pixel, and may further include additional wirings. Herein, the term "pixel" may refer to a smallest unit for displaying an image, and the OLED display device 101 displays an image using a plurality of pixels.

Each pixel PX includes the switching TFT 10, the driving TFT 20, the capacitor 80, and the OLED 210. In addition, a gate line 151 extending along one direction, and a data line 171 and a common power line 172 insulated from and intersecting (crossing) the gate line 151 are also provided at the wiring unit 130. Each pixel PX may be defined by the gate line 151, the data line 171 and the common power line 172 as a boundary, but example embodiments are not limited thereto. The pixels PX may be defined by a pixel defining layer PDL or a black matrix.

The OLED 210 may include a first electrode 211, an organic emissive layer 212 on the first electrode 211 and a second electrode 213 on the organic emissive layer 212. Holes and electrons are injected into the organic emissive layer 212 from the first electrode 211 and the second electrode 213, respectively, to be combined and form excitons. When excitons fall from an excited state to a ground state, light emission occurs.

The capacitor 80 may include a pair of capacitor plates 158 and 178, having an insulating interlayer 145 interposed therebetween. In such an example embodiment, the insulating interlayer 145 may be a dielectric element. A capacitance of the capacitor 80 is determined by electric charges accumulated in the capacitor 80 and a voltage across the pair of capacitor plates 158 and 178.

The switching TFT 10 may include a switching semiconductor layer 131, a switching gate electrode 152, a switching source electrode 173 and a switching drain electrode 174. The driving TFT 20 includes a driving semiconductor layer 132, a driving gate electrode 155, a driving source electrode 176 and a driving drain electrode 177. A gate insulating layer 140 may be further provided to insulate the semiconductor layers 131 and 132 and the gate electrodes 152 and 155.

The switching TFT 10 may function as a switching element which selects a pixel to perform light emission. The switching gate electrode 152 is connected to the gate line 151, and the switching source electrode 173 is connected to the data line 171. Spaced apart from the switching source electrode 173, the switching drain electrode 174 is connected to one of the capacitor plates, for example, the capacitor plate 158.

The driving TFT 20 applies driving power to the first electrode 211 (which is a pixel electrode), and this allows the organic emissive layer 212 of the OLED 210 in the selected pixel (e.g., in the pixel selected by the switching TFT 10) to emit light. The driving gate electrode 155 may be connected to the capacitor plate that is also connected to the switching drain electrode 174 (e.g., capacitor plate 158). Each of the driving source electrode 176 and the other one of the capacitor plates (e.g., capacitor plate 178), may be connected to the common power line 172. The driving drain electrode 177 may be connected to the first electrode 211 of the OLED 210 through a contact hole.

With the above-described structure, the switching TFT 10 is driven based on a gate voltage applied to the gate line 151 and serves to transmit a data voltage, applied to the data line 171, to the driving TFT 20. A voltage equal to a difference between a common voltage applied to the driving TFT 20 from the common power line 172 and the data voltage transmitted by (or from) the switching TFT 10 is stored in the capacitor 80, and a current corresponding to the voltage stored in the capacitor 80 flows to the OLED 210 through the driving TFT 20 such that the OLED 210 may emit light.

In an example embodiment, the first electrode 211 is an anode for injecting holes, and the second electrode 213 is a cathode for injecting electrons. However, example embodiments are not limited thereto, and the first electrode 211 may be a cathode and the second electrode 213 may be an anode.

A planarization layer 146 may be disposed on the insulating interlayer 145. The planarization layer 146 may include an insulating material, and may protect the wiring unit 130. The planarization layer 146 and the insulating interlayer 145 may include substantially the same material.

The driving drain electrode 177 of the driving TFT 20 may be connected to the first electrode 211 of the OLED 210 through a contact hole formed in the planarization layer 146.

According to an example embodiment, the first electrode 211 is a reflective electrode and the second electrode 213 is a semi-transmitting electrode, but embodiments of the present disclosure are not limited thereto. Accordingly, the light generated in the organic emissive layer 212 is emitted through the second electrode 213. That is, the OLED display device 101 according to an example embodiment has a top emission structure.

The reflective electrode and the semi-transmitting electrode may each independently include one or more metals selected from magnesium (Mg), silver (Ag), gold (Au), calcium (Ca), lithium (Li), chromium (Cr), copper (Cu) and aluminum (Al) and alloys thereof.

For example, the first electrode 211 may include a reflective layer including one or more metals selected from magnesium (Mg), silver (Ag), gold (Au), calcium (Ca), lithium (Li), chromium (Cr), copper (Cu) and aluminum (Al), and a transparent conductive layer on the reflective layer. In such an example embodiment, the transparent conductive layer may include a transparent conductive oxide (TCO). Non-limiting examples of the TCO may include indium tin oxide (ITO), indium zinc oxide (IZO), zinc oxide (ZnO), aluminum zinc oxide (AZO) and indium oxide ($In_2O_3$). Since such transparent conductive layer may have a high work function, hole injection through the first electrode 211 may become smooth.

In some embodiments, the first electrode 211 may have a triple-layer structure in which a first transparent conductive layer, a reflective electrode and a second transparent conductive layer are sequentially stacked.

The second electrode 213 may include a semi-transmitting layer including one or more metals selected from magnesium (Mg), silver (Ag), gold (Au), calcium (Ca), lithium (Li), chromium (Cr), copper (Cu) and aluminum (Al). As the thickness of the semi-transmitting layer decreases, the transmittance of light increases, and as the thickness of the semi-transmitting layer increases, the transmittance of light decreases.

The organic emissive layer 212 may include a single molecular organic material or a polymer organic material. The organic emissive layer 212 may be formed by any suitable method using any suitable organic light emitting material.

A pixel defining layer 190 positioned on the wiring unit 130 and the OLED 210 may have an opening. The opening of the pixel defining layer 190 exposes a portion of the first electrode 211. The organic emissive layer 212 and the second electrode 213 may be sequentially stacked on the portion of the first electrode 211 exposed by the opening of the pixel defining layer 190. The second electrode 213 may also be disposed on the pixel defining layer 190, in addition to being on the organic emissive layer 212. The pixel defining layer 190 may define a light emission area.

The capping layer 230 may be disposed on the OLED 210. The capping layer 230 serves to protect the OLED 210 and facilitate the effective emission of light generated in the organic emissive layer 212 toward the outside.

According to an example embodiment, the capping layer 230 includes metal iodide. The metal iodide may include at least one selected from LiI, NaI, KI, RbI, CsI, $BeI_2$, $MgI_2$, $CaI_2$, $SrI_2$ and $BaI_2$.

Non-limiting examples of the metal iodide may include alkali metal iodide and alkaline-earth metal iodide.

Non-limiting examples of the alkali metal iodide may include LiI, NaI, KI, RbI and CsI.

The alkali metal iodide is an ionic compound. Lithium iodide (LiI) may have a refractive index ranging from about 1.76 to about 1.95, sodium iodide (NaI) may have a refractive index ranging from about 1.72 to about 1.77, potassium iodide (KI) may have a refractive index ranging from about 1.68 to about 1.69, rubidium iodide (RbI) may have a refractive index ranging from about 1.65 to about 1.69 and cesium iodide (CsI) may have a refractive index ranging from about 1.66 to about 1.79.

Non-limiting examples of the alkaline-earth metal iodide may include $BeI_2$, $MgI_2$, $CaI_2$, $SrI_2$ and $BaI_2$.

An ionic compound including an alkaline-earth metal and iodine (I), such as $BeI_2$, $MgI_2$, $CaI_2$, $SrI_2$ and/or $BaI_2$, may have a refractive index ranging from about 1.6 to about 2.0.

According to an example embodiment, the capping layer 230 including the metal iodide may have a refractive index ranging from about 1.6 to about 2.0. For example, the capping layer 230 may have a refractive index ranging from about 1.7 to about 1.99. Consequently, light resonance may be achieved between a surface of the capping layer 230 having such refractive index and the first electrode 211. As a result, the luminous efficiency of the OLED display device 101 may be improved by the light resonance.

The thickness of the capping layer 230 is not particularly limited. The capping layer 230 may have any suitable thickness that would be enough to protect the OLED 210. In embodiments where the capping layer 230 is relatively thick, this may be advantageous for protecting the OLED 210. However, when the capping layer 230 is too thick, it may be difficult to slim down the OLED display device 101. In consideration of this, the capping layer 230 may have a thickness ranging from about 30 nm to about 100 nm. The thickness of the capping layer may be adjusted by those skilled in the art, based on the desired light resonance characteristics and the like.

The metal iodide may be an inorganic material. In addition, the second electrode 213 may also include an inorganic material. Accordingly, the capping layer 230 including the inorganic material (e.g., metal iodide according to the present embodiments) may be formed in a continuous process with the second electrode 213.

For example, the capping layer 230 may be manufactured by any suitable method known in the art, for example, by deposition. The second electrode 213 may also be manufactured by deposition.

In embodiments where a material for forming the capping layer 230 and a material for forming the second electrode 213 are both inorganic materials, after the second electrode 213 is formed by deposition, the capping layer 230 may be formed through a continuous process (i.e. a process during which only a deposition material is changed, without changing a deposition chamber). In embodiments where a continuous deposition process is utilized, the manufacturing process of the capping layer 230 may be simplified, and the manufacturing costs of the capping layer 230 may be reduced.

In addition, the capping layer according to embodiments of the present invention may be superior in compatibility with the second electrode 213 including the inorganic material than a comparable capping layer including an organic material, and thus the possibility of an abrupt change in physical properties occurring at an interface between the capping layer and the second electrode 213 may be prevented or reduced. Accordingly, the driving voltage of the OLED may be reduced and the luminous efficiency may be improved.

According to an example embodiment, the capping layer 230 may include only metal iodide.

However, example embodiments are not limited thereto, and the capping layer 230 may further include at least one of an inorganic material and an organic material having light transmittance, in addition to the metal iodide.

For example, the capping layer 230 may include at least one inorganic material selected from silicon oxide, magnesium fluoride, zinc oxide, titanium oxide, zirconium oxide, niobium oxide, tantalum oxide, tin oxide, nickel oxide, silicon nitride, indium nitride and gallium nitride.

In some embodiments, the capping layer 230 may further include at least one organic material selected from acryl (e.g., acrylic or polyacrylate), polyimide, polyamide, $Alq_3$ [Tris(8-hydroxyquinolinato) aluminum], poly(3,4-ethylene-dioxythiophene) (PEDOT), 4,4'-bis[N-(3-methylphenyl)-N-phenylamino]biphenyl (TPD), 4,4',4"-tris[(3-methylphenyl) phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino]benzene (m-MTDAB), 1,3,5-tris [N,N-bis (4-methylphenyl)amino] benzene (p-MTDAB), 4,4'-bis[N,N-bis(3-methylphenyl)-amino]diphenylmethane (BPPM), 2,2',2"-(1,3,5-benzene-tolyl)tris-[1-phenyl-1H-benzoimidazol] (TPBI) and 3-(4-biphenyl)-4-phenyl-5-t-butylphenyl-1,2,4-triazole (TAZ).

Hereinafter, another example embodiment will be described with reference to FIG. 3.

Figure 3:
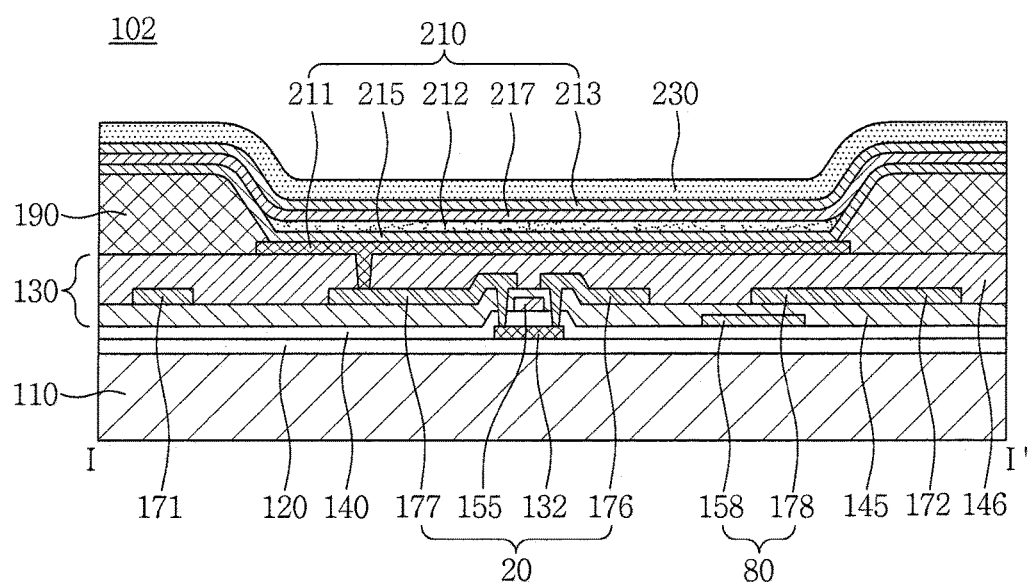
FIG. 3 is a cross-sectional view illustrating an OLED display device according to another example embodiment.

FIG. 3 is a cross-sectional view illustrating an OLED display device 102 according to an alternative example embodiment. Hereinafter, in order to avoid redundancy, descriptions of the components that are the same as or substantially similar to those already described will not be provided.

The OLED display device 102 according to this example embodiment may further include a first auxiliary emissive layer 215 between a first electrode 211 and an organic emissive layer 212. The first auxiliary emissive layer 215 may include at least one selected from a hole injection layer HIL and a hole transport layer HTL. In an example embodiment, the first auxiliary emissive layer 215 may include a hole injection layer and a hole transport layer.

The OLED display device 102 according to this example embodiment may further include a second auxiliary emissive layer 217 between the organic emissive layer 212 and a second electrode 213. The second auxiliary emissive layer 217 may include at least one selected from an electron transport layer ETL and an electron injection layer EIL. In an example embodiment, the second auxiliary emissive layer 217 may include the electron injection and the electron transport layer.

The first auxiliary emissive layer 215 and the second auxiliary emissive layer 217 may each independently extend between a pixel defining layer 190 and the second electrode 213.

The organic emissive layer 212, the hole injection layer, the hole transport layer, the electron transport layer and/or the electron injection layer may collectively be referred to as an organic layer. The organic layer may include a low molecular weight organic material or a high molecular weight organic material.

The OLED display device 102 according to an example embodiment may include only one of the first auxiliary emissive layer 215 and the second auxiliary emissive layer 217, or may include both of the first auxiliary emissive layer 215 and the second auxiliary emissive layer 217.

Hereinafter, another example embodiment will be described with reference to FIG. 4.

Figure 4:
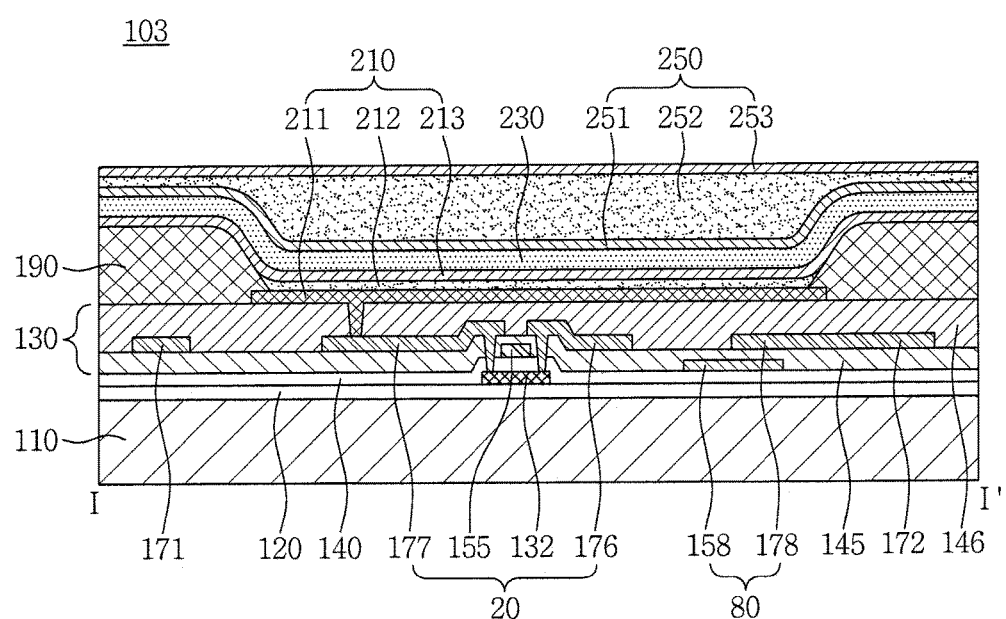
FIG. 4 is a cross-sectional view illustrating an OLED display device according to another example embodiment.

FIG. 4 is a cross-sectional view illustrating an OLED display device 103 according to another example embodiment.

The OLED display device 103 according to this example embodiment may include a thin film encapsulation layer 250 on a capping layer 230.

The thin film encapsulation layer 250 may include one or more inorganic layers 251 and 253 and one or more organic layers 252, where the inorganic and organic layers are alternately stacked from the capping layer 230. For example, in FIG. 4, the thin film encapsulation layer 250 includes two inorganic layers 251 and 253 and one organic layer 252 between the inorganic layer 251 and 253, but the structure of the thin film encapsulation layer 250 is not limited thereto.

The inorganic layers 251 and 253 may each independently include one or more inorganic materials selected from $Al_2O_3$, $TiO_2$, $ZrO$, $SiO_2$, $AlON$, $AlN$, $SiON$, $Si_3N_4$, $ZnO$ and $Ta_2O_5$. The inorganic layers 251 and 253 may be formed through methods such as a chemical vapor deposition (CVD) method and/or an atomic layer deposition (ALD) method. However, example embodiments are not limited thereto, and the inorganic layers 251 and 253 may be formed using any suitable method known to those skilled in the art.

The organic layer 252 may include a polymer-based material. Non-limiting examples of the polymer-based material may include an acrylic resin, an epoxy resin, polyimide, and polyethylene. The organic layer 252 may be formed through a thermal deposition process, for example. The thermal deposition process for forming the organic layer 252 may be performed in any suitable temperature range so long as it does not damage the OLED 210. However, example embodiments are not limited thereto, and the organic layer 252 may be formed using any suitable method known to those skilled in the pertinent art.

The inorganic layers 251 and 253, which may each independently be a relatively thin layer with a relatively high density, may substantially prevent or efficiently reduce infiltration of, for example, moisture or oxygen into the OLED 210. Accordingly, permeation of moisture and oxygen into the OLED 210 may be prevented or reduced by the inorganic layers 251 and 253.

Moisture and oxygen that have passed through the inorganic layers 251 and 253 (i.e. moisture and oxygen not blocked by the inorganic layers 251 and 253) may be further blocked by the organic layer 252. In addition to performing the function of preventing or reducing the infiltration of moisture in the OLED, the organic layer 252 may also serve as a buffer layer to reduce stress between the respective ones of the inorganic layers 251 and 253. Further, since the organic layer 252 has planarization characteristics, an uppermost surface of the thin film encapsulation layer 250 may be planarized by the organic layer 252.

The thin film encapsulation layer 250 may have a thickness that is less than or equal to about 10 μm. Accordingly, the OLED display device 103 may have a relatively small (slim) thickness. Thus, the OLED display device 103 may have good flexibility characteristics.

Hereinafter, another example embodiment will be described with reference to FIG. 5.

Figure 5:
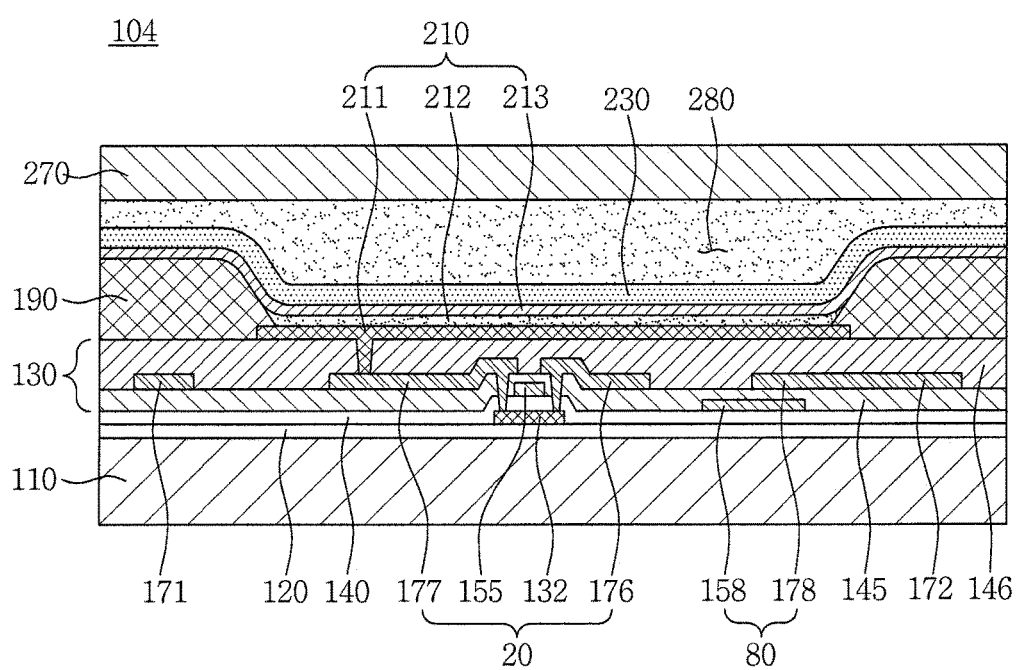
FIG. 5 is a cross-sectional view illustrating an OLED display device according to another example embodiment.

FIG. 5 is a cross-sectional view illustrating an OLED display device 104 according to another example embodiment.

The OLED display device 104 according to this example embodiment may include a filler 280 on a capping layer 230 and an encapsulation substrate 270 on the filler 280.

The encapsulation substrate 270 may be a transparent insulating substrate including glass, quartz, ceramics, plastic, and/or the like. The encapsulation substrate 270 may be on a substrate 110 and may function as a sealant to protect an OLED 210.

The filler 280 may include an organic material, for example, a polymer. The filler 280 may have a refractive index that is greater than or less than that of the capping layer 230. Alternatively, the filler 280 may have substantially the same refractive index as that of the capping layer 230.

The filler 280 may be selected according to the refractive index of the capping layer 230 and the encapsulation substrate 270. For example, in the case where the encapsulation substrate 270 is a glass substrate having a refractive index of about 1.5, a polymer having a refractive index of about 1.5 may be used as a material for the filler 280. The material of the filler 280 may include poly (methyl methacrylate) (PMMA), for example.

Since the filler 280 fills the space between the capping layer 230 and the encapsulation substrate 270, the strength and durability of the OLED display device 104 may be improved by the filler 280.

Hereinafter, another example embodiment will be described with reference to FIGS. 6 and 7.

Figure 6:
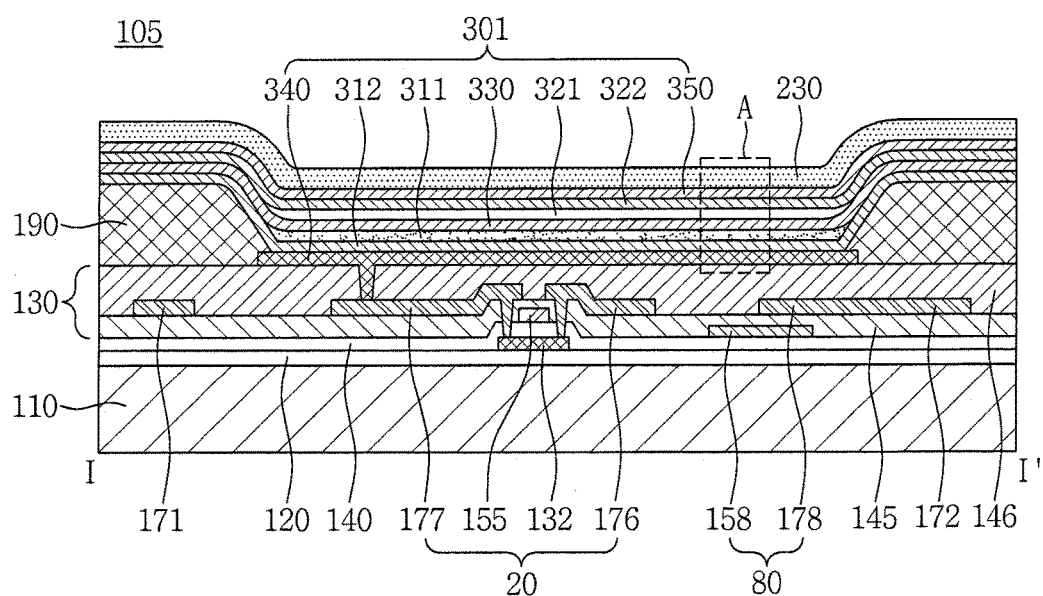
FIG. 6 is a cross-sectional view illustrating an OLED display device according to another example embodiment.
Figure 7:
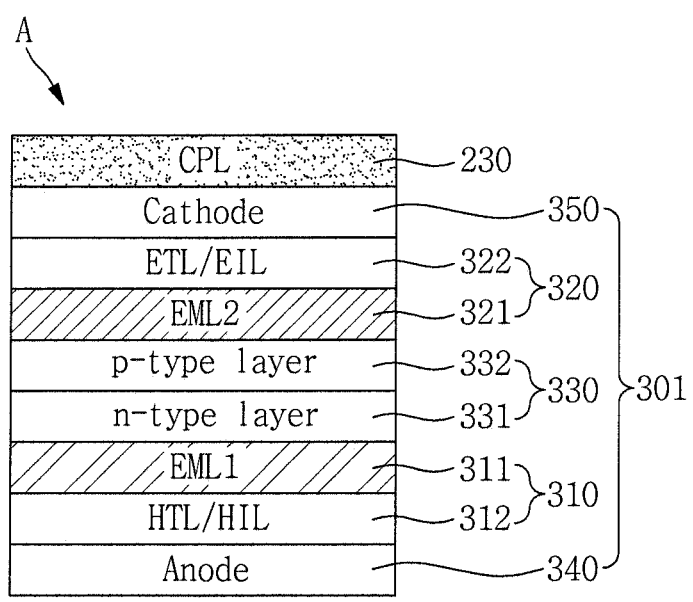
FIG. 7 is an enlarged cross-sectional view illustrating a portion "A" of FIG. 6.

FIG. 6 is a cross-sectional view illustrating an OLED display device 105 according to another example embodiment, and FIG. 7 is an enlarged cross-sectional view illustrating a portion "A" of FIG. 6.

The OLED display device 105 according to this example embodiment includes an OLED 301 and a capping layer 230. The OLED 301 may include two light emitting units 310 and 320 that are connected in series.

Referring to FIGS. 6 and 7, the OLED 301 may include a first electrode 340 on a substrate 110, a first light emitting unit 310 on the first electrode 340, a charge generation layer 330 on the first light emitting unit 310, a second light emitting unit 320 on the charge generation layer 330 and a second electrode 350 on the second light emitting unit 320. The first light emitting unit 310 may include a first organic emissive layer 311 between the first electrode 340 and the charge generation layer 330, and the second light emitting unit 320 may include a second organic emissive layer 321 between the charge generation layer 330 and the second electrode 350.

The OLED 301 illustrated in FIGS. 6 and 7 has a tandem structure in which the two light emitting units 310 and 320 are connected in series. Here, the first light emitting unit 310 is disposed adjacent to the first electrode 340, and the second light emitting unit 320 is disposed adjacent to the second electrode 350.

In FIG. 7, the structure in which the first electrode 340 is an anode and the second electrode 350 is a cathode is illustrated. However, example embodiments are not limited thereto, and the first electrode 340 may be a cathode and the second electrode 350 may be an anode.

According to an example embodiment, one of the first organic emissive layer 311 and the second organic emissive layer 321 is a blue emissive layer and the other one of the first organic emissive layer 311 and the second organic emissive layer 321 is a yellow emissive layer. In this embodiment, the OLED 301 may be a white organic light emitting diode ("WOLED") that emits white light.

For example, the first organic emissive layer 311 illustrated in FIG. 7 may be a blue emissive layer. In this embodiment, the first organic emissive layer 311 may include a blue light emitting material. For example, the second organic emissive layer 321 illustrated in FIG. 7 may be a yellow emissive layer. In this embodiment, the second organic emissive layer 321 may include a yellow light emitting material. However, example embodiments of the present disclosure are not limited thereto. In some embodiments, the first organic emissive layer 311 may be a yellow emissive layer and the second organic emissive layer 321 may be a blue emissive layer.

The OLED 301 may further include a first auxiliary emissive layer 312 between the first electrode 340 and the first organic emissive layer 311.

The first auxiliary emissive layer 312 may include at least one of a hole injection layer (HIL) and a hole transport layer (HTL). For example, the first auxiliary emissive layer 312 may include a hole injection layer and a hole transport layer (HTL/HIL).

In some embodiments, the OLED 301 may include a second auxiliary emissive layer 322 between the second organic emissive layer 321 and the second electrode 350.

The second auxiliary emissive layer 322 may include at least one of an electron transport layer (ETL) and an electron injection layer (EIL). For example, the second auxiliary emissive layer 322 may include an electron injection layer and an electron transport layer (ETL/EIL)

The charge generation layer 330 may be disposed between the first light emitting unit 310 and the second light emitting unit 320. The charge generation layer 330 controls the charge between the first light emitting unit 310 and the second light emitting unit 320 so that the charge balance between the first light emitting unit 310 and the second light emitting unit 320 may be achieved. The charge generation layer 330 may include an n-type layer 331 disposed adjacent to the first light emitting unit 310 and supplying electrons to the first light emitting unit 310; and a p-type layer 332 disposed adjacent to the second light emitting unit 320 and supplying holes to the second light emitting unit 320.

The charge generation layer 330 may include a metal such as aluminum (Al), or may include a transparent conductive material such as indium tin oxide (ITO), without limitation.

In some embodiments, the charge generation layer 330 may include an organic material, and the organic material may be doped with an n-type material and/or a p-type material to form the charge generation layer 330. For example, in order to facilitate the supply of electrons, an n-type material may be doped into the organic material to form an n-type layer 331. In order to facilitate the supply of holes, a p-type material may be doped into the organic material to form a p-type layer 332.

When a voltage is applied between the first electrode 340 and the second electrode 350 of the OLED 301 illustrated in FIGS. 6 and 7, electrons generated in the n-type layer 331 move to the first light emitting unit 310, and holes injected from the first electrode 340 move to the first light emitting unit 310, and the electrons and the holes combine in the first light emitting unit 310 to emit light.

Meanwhile, electrons injected from the second electrode 350 move to the second light emitting unit 320 and holes generated in the p-type layer 332 move to the second light emitting unit 320, and the electrons and the holes combine in the second light emitting unit 320 to emit light.

In an embodiment, a color filter may be disposed on the capping layer 230. In such example embodiment, the color filter may be disposed so as to overlap the OLED 301. For example, a red color filter, a green color filter and a blue color filter may each independently be arranged in each OLED 301. The OLED display device 105 may realize various colors by using the OLED 301 and the color filter.

Hereinafter, another example embodiment will be described with reference to FIG. 8.

Figure 8:
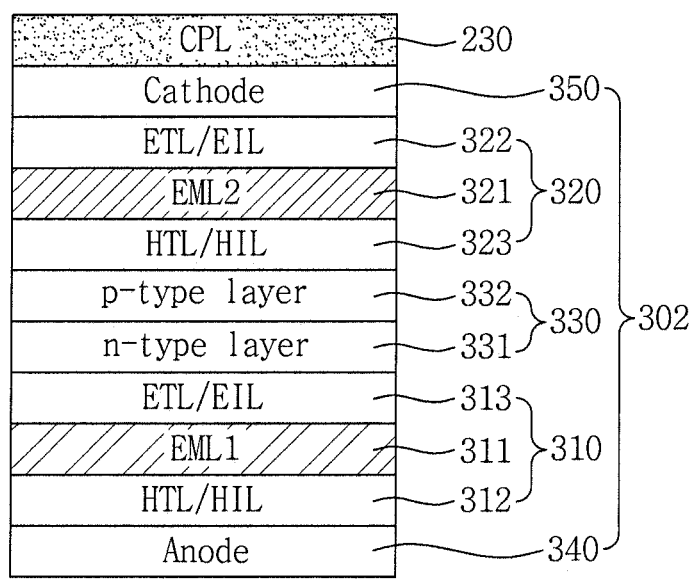
FIG. 8 is a cross-sectional view illustrating a portion of an OLED display device according to another example embodiment.

FIG. 8 is a cross-sectional view illustrating a portion of an OLED display device 106 according to another example embodiment. The OLED display device 106 according to another example embodiment includes an OLED 302.

The OLED 302 illustrated in FIG. 8, as compared with the OLED 301 illustrated in FIG. 7, may further include a third auxiliary emissive layer 313 between a first organic emissive layer 311 and a charge generation layer 330. The third auxiliary emissive layer 313 may include at least one of an electron transport layer (ETL) and an electron injection layer (EIL). For example, the third auxiliary emissive layer 313 may include an electron injection layer and an electron transport layer (ETL/EIL).

In addition, the OLED 302 illustrated in FIG. 8 may further include a fourth auxiliary emissive layer 323 between the charge generation layer 330 and the second organic emissive layer 321. The fourth auxiliary emissive layer 323 may include at least one of a hole injection layer (HIL) and a hole transport layer (HTL). For example, the fourth auxiliary emissive layer 323 may include a hole injection layer and a hole transport layer (HTL/HIL).

Hereinafter, another example embodiment will be described with reference to FIG. 9.

Figure 9:
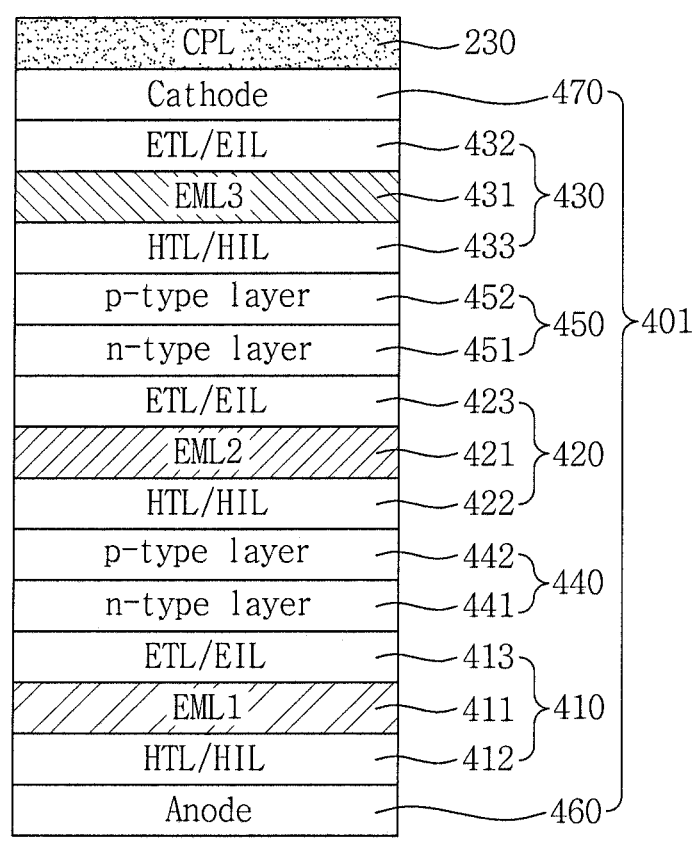
FIG. 9 is a cross-sectional view illustrating a portion of an OLED display device according to another example embodiment.

FIG. 9 is a cross-sectional view illustrating a portion of an OLED display device 107 according to another example embodiment.

Referring to FIG. 9, the OLED display device 107 according to another example embodiment includes an OLED 401 and a capping layer 230 on the OLED 401. Detailed descriptions of the capping layer 230 will not be provided again.

The OLED 401 may include three light emitting units 410, 420 and 430 arranged in series and two charge generation layers 440 and 450 between the respective light emitting units 410, 420 and 430.

Referring to FIG. 9, the OLED 401 includes a first electrode 460, a first light emitting unit 410, a first charge generation layer 440, a second light emitting unit 420, a second charge generation layer 450, a third light emitting unit 430 and a second electrode 470 that are sequentially stacked.

In FIG. 9, the structure in which the first electrode 460 is an anode and the second electrode 470 is a cathode is illustrated. However, example embodiments are not limited thereto.

The first light emitting unit 410 includes a first auxiliary emissive layer 412, a first organic emissive layer 411, and a second auxiliary emissive layer 413.

The second light emitting unit 420 includes a third auxiliary emissive layer 422, a second organic emissive layer 421 and a fourth auxiliary emissive layer 423.

The third light emitting unit 430 includes a fifth auxiliary emissive layer 433, a third organic emissive layer 431 and a sixth auxiliary emissive layer 432.

The first, third and fifth auxiliary emissive layers 412, 422 and 433 may each independently include at least one of a hole injection layer (HIL) and a hole transport layer (HTL). For example, the first, third and fifth auxiliary emissive layers 412, 422 and 433 may each include a hole injection layer and a transport layer (HTL/HIL).

The second, fourth and sixth auxiliary emissive layers 413, 423 and 432 may each independently include at least one of an electron transport layer (ETL) and an electron injection layer (EIL). For example, the second, fourth and sixth auxiliary emissive layers 413, 423 and 432 may each include an electron injection layer and an electron layer (ETL/EIL).

The first charge generation layer 440 may include an n-type layer 441 and a p-type layer 442.

The second charge generation layer 450 may also include an n-type layer 451 and a p-type layer 452.

The OLED 401 illustrated in FIG. 9 may be a white organic light emitting diode (WOLED) that emits white light. Each of the first light emitting unit 410, the second light emitting unit 420 and the third light emitting unit 430 may emit light having one of red, green, and blue colors.

However, example embodiments of the present disclosure are not limited thereto. For example, two of the first light emitting unit 410, the second light emitting unit 420 and the third light emitting unit 430 may emit blue light and the remaining light emitting unit may emit yellow light. In some embodiments, two of the first light emitting unit 410, the second light emitting unit 420 and the third light emitting unit 430 may emit yellow light and the remaining light emitting unit may emit blue light.

Hereinafter, another example embodiment will be described with reference to FIG. 10.

Figure 10:
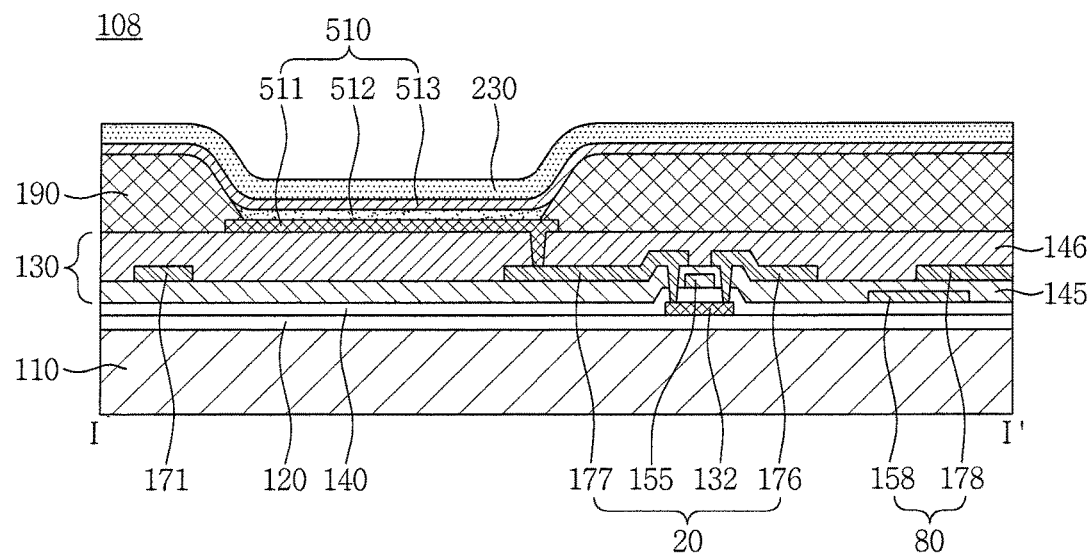
FIG. 10 is a cross-sectional view illustrating an OLED display device according to another example embodiment.

FIG. 10 is a cross-sectional view illustrating an OLED display device 108 according to another example embodiment. The OLED display device 108 illustrated in FIG. 10 includes a substrate 110, a wiring unit 130, an OLED 510 and a capping layer 230.

The OLED 510 includes a first electrode 511, an organic emissive layer 512 and a second electrode 513. In this example embodiment, the first electrode 511 is a light transmitting electrode and the second electrode 513 is a reflective electrode. Accordingly, light generated in the organic emissive layer 512 is transmitted through the first electrode 511 and the substrate 110 and is emitted to the outside. That is, the OLED display device 108 illustrated in FIG. 10 has a bottom emission structure.

Wirings disposed (located) in the wiring unit 130 and the driving TFT 20 may be arranged so as to substantially minimize or reduce the overlap with the OLED 510, in order to substantially prevent or reduce the light emitted from the organic emissive layer 512 from being disturbed.

Figure 11:
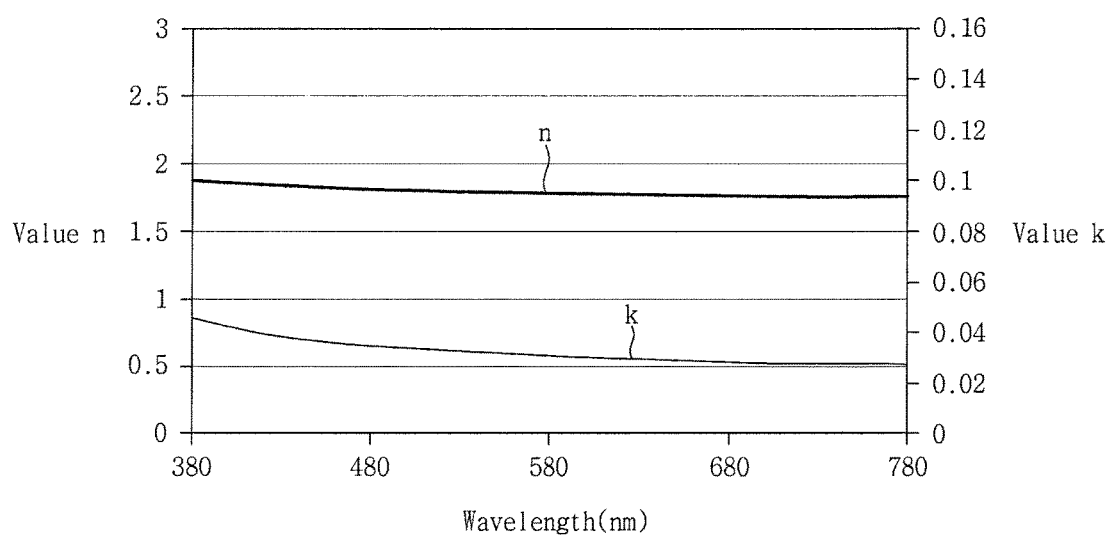
FIG. 11 is a graph illustrating a refractive index of a layer including calcium iodide.

FIG. 11 is a graph illustrating a refractive index of an inorganic layer including calcium iodide.

FIG. 11 shows the results of measuring a refractive index (n) and an extinction coefficient (k) of a $CaI_2$ layer after depositing $CaI_2$ on a glass substrate using a pilot evaporator to form a $CaI_2$ layer having a thickness of about 36 nm. In this example embodiment, the refractive index was measured according to the wavelength of light irradiated to the $CaI_2$ layer.

As can be seen from FIG. 11, when a light having a wavelength of about 551 nm is irradiated to the $CaI_2$ layer, the $CaI_2$ layer may have a refractive index (n) of about 1.8. An inorganic layer (e.g., a $CaI_2$ layer) having such refractive index may be used as an inorganic capping layer.

As set forth hereinabove, the OLED display device according to one or more example embodiments includes the capping layer including metal iodide. According to one or more example embodiments, costs of manufacturing the capping layer may be reduced. In addition, the capping layer according to one or more example embodiments may be superior in compatibility with the second electrode 213, than a comparable capping layer including an organic material. Accordingly, the driving voltage of the OLED may be reduced and the luminous efficiency may be improved.

While the present invention has been illustrated and described with reference to the example embodiments thereof, it will be apparent to those of ordinary skill in the art that various changes in form and detail may be made thereto without departing from the spirit and scope of the present invention as defined by the following claims and equivalents thereof.

What is claimed is:

1. An organic light emitting diode display device comprising:
   a substrate;
   an organic light emitting diode on the substrate; and
   a capping layer in direct contact with the organic light emitting diode,
   wherein the capping layer comprises metal iodide and has a refractive index ranging from about 1.6 to about 2.0, and
   wherein the capping layer has a thickness ranging from about 30 nm to about 100 nm.

2. The organic light emitting diode display device as claimed in claim 1, wherein the metal iodide comprises at least one selected from the group consisting of alkali metal iodide, alkaline-earth metal iodide and combinations thereof.

3. The organic light emitting diode display device as claimed in claim 1, wherein the metal iodide comprises at least one selected from the group consisting of LiI, NaI, KI, RbI, CsI, $BeI_2$, $MgI_2$, $CaI_2$, $SrI_2$, $BaI_2$ and combinations thereof.

4. The organic light emitting diode display device as claimed in claim 1, wherein the organic light emitting diode comprises:
   a first electrode on the substrate;

an organic emissive layer on the first electrode; and
a second electrode on the organic emissive layer.

5. The organic light emitting diode display device as claimed in claim 4, wherein the organic light emitting diode further comprises at least one selected from a hole injection layer and a hole transport layer, between the first electrode and the organic emissive layer.

6. The organic light emitting diode display device as claimed in claim 4, wherein the organic light emitting diode further comprises at least one selected from an electron transport layer and an electron injection layer, between the organic emissive layer and the second electrode.

7. The organic light emitting diode display device as claimed in claim 1, further comprising a thin film encapsulation layer on the capping layer,
wherein the thin film encapsulation layer comprises:
at least one inorganic layer; and
at least one organic layer arranged alternately with the at least one inorganic layer.

8. The organic light emitting diode display device as claimed in claim 1, wherein the organic light emitting diode comprises:
a first electrode on the substrate;
a first light emitting unit on the first electrode;
a charge generation layer on the first light emitting unit;
a second light emitting unit on the charge generation layer; and
a second electrode on the second light emitting unit,
wherein the first light emitting unit comprises a first organic emissive layer between the first electrode and the charge generation layer, and
the second light emitting unit comprises a second organic emissive layer between the charge generation layer and the second electrode.

9. The organic light emitting diode display device as claimed in claim 8, wherein one of the first organic emissive layer and the second organic emissive layer is a blue emissive layer and the other one of the first organic emissive layer and the second organic emissive layer is a yellow emissive layer.

10. The organic light emitting diode display device as claimed in claim 8, further comprising a first auxiliary emissive layer between the first electrode and the first organic emissive layer.

11. The organic light emitting diode display device as claimed in claim 10, wherein the first auxiliary emissive layer comprises at least one selected from a hole injection layer and a hole transport layer.

12. The organic light emitting diode display device as claimed in claim 8, further comprising a second auxiliary emissive layer between the second organic emissive layer and the second electrode.

13. The organic light emitting diode display device as claimed in claim 12, wherein the second auxiliary emissive layer comprises at least one selected from an electron transport layer and an electron injection layer.

14. The organic light emitting diode display device as claimed in claim 1, further comprising a filler on the capping layer.

15. The organic light emitting diode display device as claimed in claim 14, wherein the filler has substantially the same refractive index as a refractive index of the capping layer.

16. The organic light emitting diode display device as claimed in claim 14, further comprising an encapsulation substrate on the filler.

17. The organic light emitting diode display device as claimed in claim 16, wherein the filler has substantially the same refractive index as a refractive index of the encapsulation substrate.

18. An organic light emitting diode display device comprising:
a substrate;
an organic light emitting diode on the substrate; and
a capping layer in direct contact with the organic light emitting diode,
wherein the capping layer comprises metal iodide, and
the capping layer does not comprise an organic material.

19. An organic light emitting diode display device comprising:
a substrate;
an organic light emitting diode on the substrate; and
a capping layer in direct contact with the organic light emitting diode,
wherein the capping layer comprises metal iodide consisting of LiI, NaI, KI, RbI, CsI, $BeI_2$, $CaI_2$, $SrI_2$, and combinations thereof.

* * * * *